US009046902B2

(12) United States Patent
Chen

(10) Patent No.: US 9,046,902 B2
(45) Date of Patent: Jun. 2, 2015

(54) POWER SUPPLY CIRCUIT

(71) Applicant: Zefu Chen, Shanghai (CN)

(72) Inventor: Zefu Chen, Shanghai (CN)

(73) Assignee: Ricoh Company, Ltd., Tokyo (JP)

( * ) Notice: Subject to any disclaimer, the term of this patent is extended or adjusted under 35 U.S.C. 154(b) by 84 days.

(21) Appl. No.: 14/024,804

(22) Filed: Sep. 12, 2013

(65) Prior Publication Data

US 2014/0084893 A1 Mar. 27, 2014

(30) Foreign Application Priority Data

Sep. 27, 2012 (CN) .......................... 2012 1 0366318

(51) Int. Cl.
*H02M 3/155* (2006.01)
*G05F 5/00* (2006.01)
*H03K 17/28* (2006.01)

(52) U.S. Cl.
CPC ........................................ *G05F 5/00* (2013.01)

(58) Field of Classification Search
CPC ................................ H02M 1/36; H02M 3/155
USPC .................... 323/299, 908; 361/87, 93.9, 101
See application file for complete search history.

(56) References Cited

U.S. PATENT DOCUMENTS

| | | | | |
|---|---|---|---|---|
| 5,321,313 | A * | 6/1994 | Oberhauser | 327/432 |
| 6,184,669 | B1 * | 2/2001 | Matsuo | 323/303 |
| 6,225,797 | B1 * | 5/2001 | Willis et al. | 323/351 |
| 8,464,078 | B2 * | 6/2013 | Brooks et al. | 713/300 |

* cited by examiner

*Primary Examiner* — Gary L Laxton
(74) *Attorney, Agent, or Firm* — Harness, Dickey & Pierce, P.L.C.

(57) ABSTRACT

Disclosed is a power supply circuit of an electric device. The power supply circuit comprises a power source configured to output a power source voltage; a power source voltage detecting circuit configured to detect the power source voltage, and to output a first voltage control signal; a leading edge delay circuit configured to receive the first voltage control signal, and to output a second voltage control signal; an electronic switch connected in series between the power source and the load, configured to turn on or turn off power supply from the power source to the load; and a slow turn-on circuit configured to receive the second voltage control signal.

4 Claims, 6 Drawing Sheets

POWER SUPPLY CIRCUIT

BACKGROUND OF THE INVENTION

1. Field of the Invention

The present invention relates to a power supply circuit, and more particularly relates to a power supply circuit able to suppress inrush current generated at the moment when a power source is turned on and able to decrease power consumption when an electronic device is in a sleep mode.

2. Description of the Related Art

As for an electronic device, a power supply circuit is absolutely imperative. In conventional techniques, the power supply circuit for the electronic device has plural structures in general. One of them is taken as an example for illustration as follows.

FIG. 1 illustrates a main part of a power supply circuit 1 in the conventional techniques. In what follows, the working principle of the power supply circuit 1 in the conventional techniques is described by referring to FIG. 1.

As shown in FIG. 1, the power supply circuit 1 has a power source 11, a mechanical switch 17, an electronic switch 12, a current limiting resistor $R_L$, a power source voltage detecting circuit 13, a control unit 15, and a load 16. The electronic switch 12 is, for example, a current controlled unit FET, and the control unit 15 is, for example, a MCU. The power source 11 outputs power source voltage V1 for providing direct current to the load 16. The power source voltage detecting circuit 13 is used for detecting the power source voltage V1 downstream of the mechanical switch 17. After the power source voltage detecting circuit 13 has detected the power source voltage V1, it outputs a first voltage control signal C1 to the MCU. After the MCU has received the first voltage control signal C1, it outputs a second voltage signal C2 to the FET. The FET is turned on after receiving the second voltage signal C2.

However, during a delay time period T from the time point when the first voltage control signal C1 is generated to the time point when the second voltage control signal C2 is generated, the FET is in a turn-off state. In this time period T, the power source voltage V1 provides electricity to the load 16 via the current limiting resistor $R_L$. At this time, the power source voltage V1 is not directly applied to the load 16 via a switch component, but provides electricity to the load 16 via the current limiting resistor $R_L$. That is to say, the current value provided to the load 16 via the current limiting resistor $R_L$ is $I=V1/R_L$. As a result, in the power supply circuit 1, inrush current generated at the moment when the power source 11 is turned on is suppressed by disposing a series-connected current limiting resistor $R_L$ between the power source 11 and the load 16.

However, in a case where the power supply circuit 1 is in a sleep mode, although the FET is turned off, the power source voltage V1 may still generate a loop via the current limiting resistor $R_L$, and consume unnecessary power. Moreover, the power supply circuit 1 cannot satisfy the strict requirements of the Energy Star program with the conventional techniques.

Therefore, in a power supply circuit, how to not only be able to suppress the inrush current generated at the moment when a power source is turned on but also be able to decrease the power consumed when an electronic device is in a sleep mode has become a problem that needs to be solved.

SUMMARY OF THE INVENTION

The present invention is proposed in order to solve the above problem in the conventional techniques. The aim of the present invention is to provide a power supply circuit by which not only the inrush current generated at the moment when a power source is turned on may be suppressed, but also the power consumed when an electronic device is in a sleep mode may be decreased.

According to one aspect of the present invention, a power supply circuit used in an electric device is provided. The power supply circuit comprises a power source configured to output a power source voltage by which direct current is provided to a load; a power source voltage detecting circuit configured to detect the power source voltage, and to output a first voltage control signal whose leading edge corresponds to turn-on of the power source and whose trailing edge corresponds to turn-off of the power source; a leading edge delay circuit configured to receive the first voltage control signal, and to output a second voltage control signal whose leading edge is delayed by a predetermined time period relative to the leading edge of the first voltage control signal and whose trailing edge coincides with the trailing edge of the first voltage control signal; an electronic switch connected in series between the power source and the load, configured to turn on or turn off power supply from the power source to the load; and a slow turn-on circuit configured to receive the second voltage control signal. The slow turn-on circuit outputs, to the electric switch, a switch voltage signal whose leading edge is used to control turn-on of the electronic switch and whose trailing edge is used to control turn-off of the electronic switch. A start time of the leading edge of the switch voltage signal coincides with a start time of the leading edge of the second voltage control signal, but a rate of change of the leading edge of the switch voltage signal is slower than a rate of change of the leading edge of the second voltage control signal, so that when the power source is turned on, a current flowing through the electronic switch is low enough to not be able to ruin a component through which the current flows. The trailing edge of the switch voltage signal coincides with the trailing edge of the second voltage control signal.

Furthermore, a mechanical switch is connected in series between the power source and the electronic switch. The mechanical switch is configured to control the turn-on or the turn-off of the power source. The power source voltage detecting circuit is configured to detect a power source voltage downstream of the mechanical switch.

Furthermore, the slow turn-on circuit comprises a first resistor whose first end is connected to a first end of the electronic switch; a capacitor connected between a second end of the first resistor and ground; a second resistor whose first end is connected to the first end of the electronic switch; a third resistor whose first end is connected to a second end of the second resistor and a control end of the electronic switch; a transistor whose base receives the second voltage control signal, whose collector is connected to the second end of the third resistor, and whose emitter is connected to ground; and a diode connected between the second end of the first resistor and the second end of the second resistor. When the transistor is turned on, the capacitor may discharge via the diode, and then the capacitor may accomplish charging within the predetermined time period for delay.

Furthermore, the electronic switch is a field effect transistor whose source serves as the first end of the electronic switch, whose gate serves as the control end of the electronic switch, and whose drain serves as the second end of the electronic switch.

As a result, according to the above described power supply circuit, it is possible to not only be able to suppress the inrush current generated at the moment when the power source is turned on but also be able to decrease the power consumed when the electronic device is in a sleep mode. Additionally, it is also possible to relax the current specification of the relevant component in the electronic device, thereby being able to ensure the reliability and the safety of the electronic device.

Figure 1:
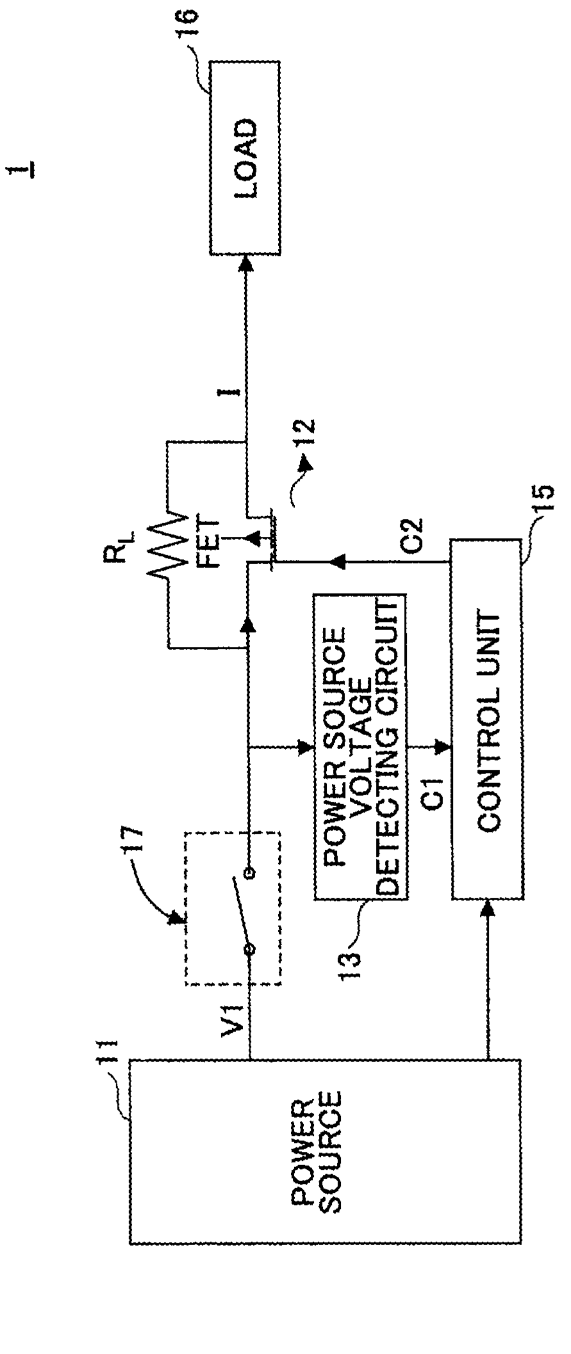
FIG. 1 illustrates an example of a main part of a power supply circuit in the conventional techniques.

Brief description of the reference symbols in the drawings is as follows:

11 or 21: a power source;
12 or 22: an electronic switch;
17 or 27: a mechanical switch;
13, 23, 23', or 23": a power source voltage detecting circuit;
15: a control unit;
24: a slow turn-on circuit;
25: a leading edge delay circuit;
16 or 26: a load;
C1: a first voltage control signal;
C2: a second voltage control signal;
S1: a switch voltage signal;
Q1: a transistor;
D: a diode; and
R1, R2, R3, R4, R5, R6, R7, R8, or R9: a resistor.

DETAILED DESCRIPTION OF THE PREFERRED EMBODIMENTS

Hereinafter, embodiments of the present invention will be concretely described with reference to the drawings. However, it should be noted that the same symbols, which are in the specification and the drawings, stand for constructional elements having the basically-same function and structure, and repeated explanations for the constructional elements are omitted.

Figure 2:
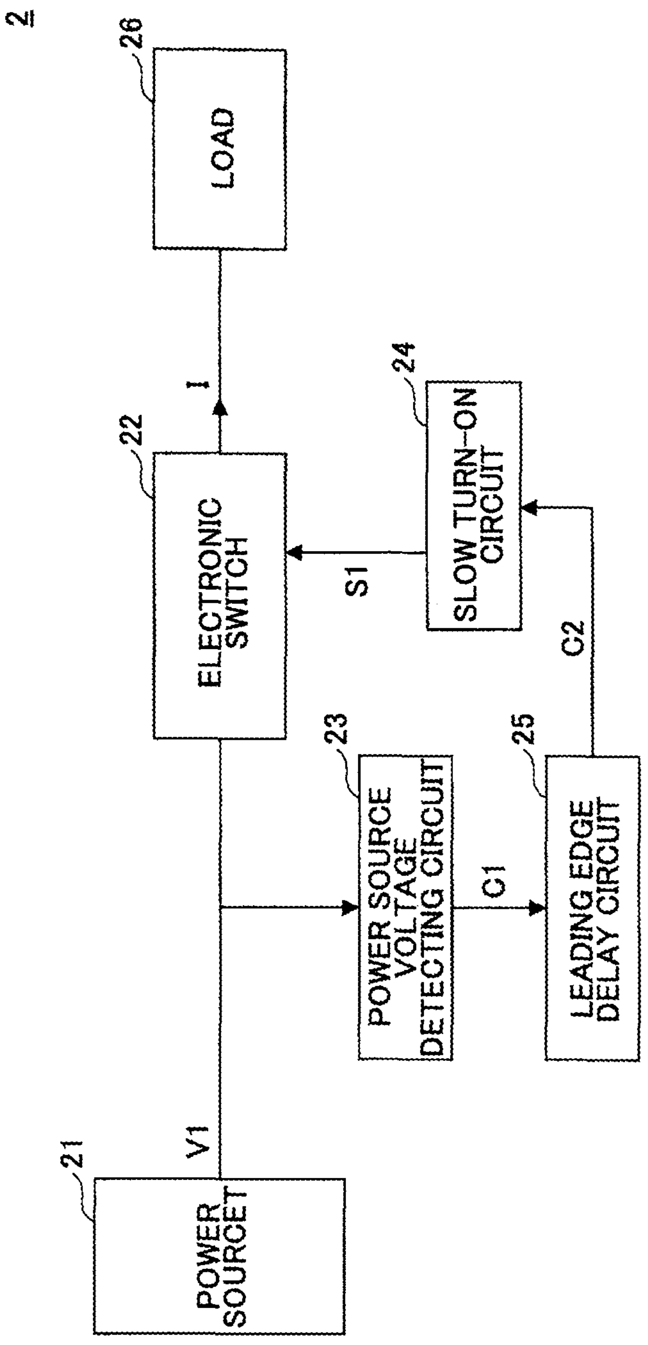
FIG. 2 illustrates a structure of a main part of a power supply circuit according to an embodiment of the present invention.

FIG. 2 illustrates a structure of a main part of a power supply circuit according to an embodiment of the present invention.

As an example of a power supply circuit 2 according to an embodiment of the present invention, the power supply circuit 2 used in an electronic device includes a power source 21, a power source voltage detecting circuit 23, a leading edge delay circuit 25, an electronic switch 22, and a slow turn-on circuit 24 as shown in FIG. 2.

The power source 21 is configured to output power source voltage V1 by which direct current is provided to a load 26. The power source voltage detecting circuit 23 is configured to detect the power source voltage V1, and to output a first voltage control signal C1 whose leading edge corresponds to the turn-on of the power source 21 and whose trailing edge corresponds to the turn-off of the power source 21. The leading edge delay circuit 25 is configured to receive the first voltage control signal C1, and to output a second voltage control signal C2 whose leading edge is delayed by a predetermined time period T relative to the leading edge of the first voltage control signal C1 and whose trailing edge coincides with the trailing edge of the first voltage control signal C1. The electronic switch 22 is configured to be connected in series between the power source 21 and the load 26, and to turn on or turn off the power supply from the power source 21 to the load 26. The slow turn-on circuit 24 is configured to receive the second voltage control signal C2, and to output, to the electronic switch 22, a switch voltage signal S1 whose leading edge is used to control the turn-on the electronic switch 22 and whose trailing edge is used to control the turn-off of the electronic switch 22. The start time of the leading edge of the switch voltage signal S1 coincides with the start time of the leading edge of the second voltage control signal C2, but the rate of change of the leading edge of the switch voltage signal S1 is slower that the rate of change of the leading edge of the second voltage control signal C2, so that when the power source 21 is turned on, the current flowing through the electronic switch 22 is not high enough to be able to ruin a component through which the current flows. The trailing edge of the switch voltage signal S1 coincides with the trailing edge of the second voltage control signal C2.

Figure 4:
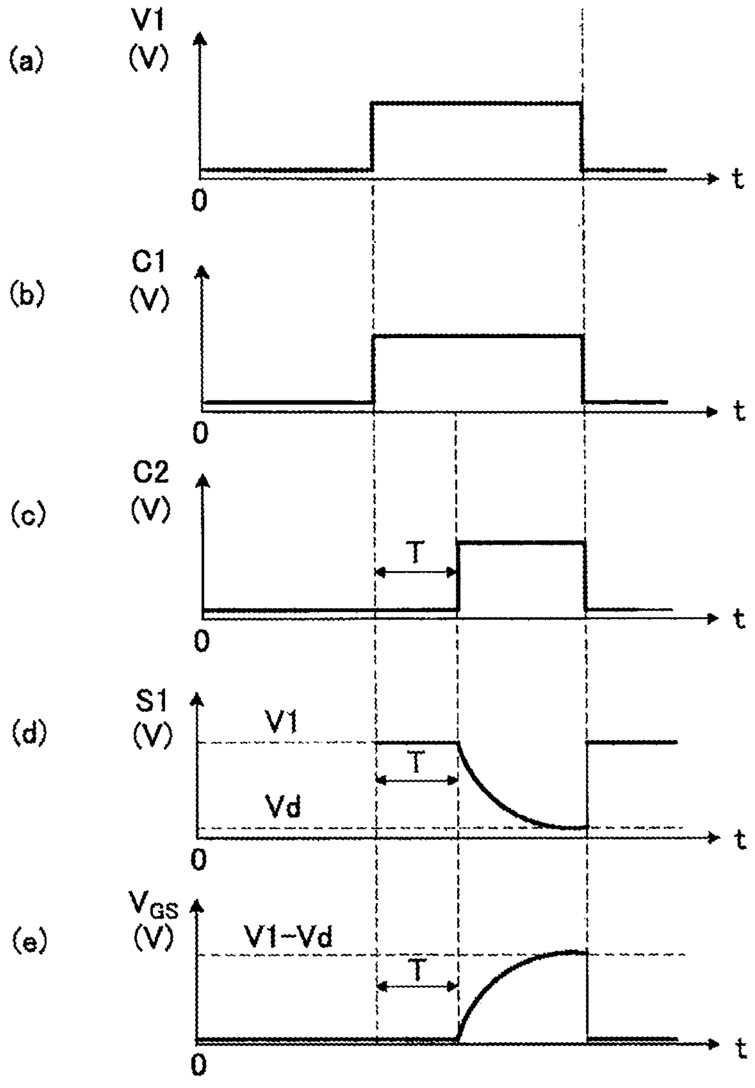
FIG. 4 illustrates an example of a waveform diagram of a main node of a power supply circuit according to an embodiment of the present invention.

FIG. 4 illustrates an example of a waveform diagram of a main node of a power supply circuit according to an embodiment of the present invention.

In what follows, a process, carried out by the power supply circuit 2, of suppressing the inrush current generated at the moment when the power source 21 is turned on and decreasing the power consumed when the electronic device is in a sleep mode is concretely described by referring to FIGS. 2 and 4.

The power source voltage detecting circuit 23 continuously detects the power source voltage V1. The waveform of the power source voltage V1 is, for example, as shown in (a) of FIG. 4. After the power source voltage detecting circuit 23 has detected the power source voltage V1, it outputs the first voltage control signal C1 to the leading edge delay circuit 25; for example, the first voltage control signal C1 is high level. As shown in (a) and (b) of FIG. 4, the leading edge and the trailing edge of the first voltage control signal C1 coincide with the power source voltage V1. After the leading edge delay circuit 25 has received the first voltage control signal C1, it outputs the second voltage control signal C2 to the slow turn-on circuit 24. The second voltage control signal C2 is delayed by a predetermined time period T; for example, the second voltage control signal C2 is high level. As shown in (b) and (c) of FIG. 4, the leading edge of the second voltage control signal C2 is delayed by the predetermined time period T relative to that of the first voltage control signal C1, and the trailing edge of the second voltage control signal C2 coincides with that of the first voltage control signal C1. After the slow turn-on circuit 24 has received the second voltage control signal C2, it outputs the switch voltage signal S1 to the electronic switch 22. As shown in (c) and (d) of FIG. 4, the start time of the switch voltage signal S1 coincides with the start time of the second voltage control signal C2, and the trailing edge of the switch voltage signal S1 coincides with the trailing edge of the second voltage control signal C2. However, the switch voltage signal S1 changes slowly from its start edge, for example, decreases slowly until it reaches a stable voltage Vs. Under the control of this kind of switch voltage signal S1, the current I flowing through the electronic switch 22 changes slowly, for example, increases slowly, thereby turning on the electronic switch 22 slowly. As a result, after the power source is turned on, the current I flowing through the electronic switch 22 to the load 22 does not increase quickly (at once), but increases slowly. In this way, the inrush current generated at the moment when the power source is turned on may be suppressed.

The power source voltage detecting circuit 23 continuously detects the power source voltage V1. If the power source voltage detecting circuit 23 does not detect the power source voltage V1, then the power source voltage V1 is, for example, the same with the part after the trailing edge as shown in (a) of FIG. 4; for example, this part is low level. On the contrary, the first voltage control signal C1 output from the power source voltage detecting circuit 23 to the leading edge delay circuit 25 becomes transient, for example, from high level to low level. At the same time, the second voltage control signal C2 output from the leading edge delay circuit 25 to the slow turn-on circuit 24 becomes transient, for example, from high level to low level. The switch voltage signal S1 output from the slow turn-on circuit 24 to the electronic switch 22 becomes transient, for example, from a stable voltage Vd to the power source voltage V1. After the switch voltage signal S1 has become the power source voltage V1, the electronic switch 22 is turned off at once. In this way, when the power supply from the power source 21 to the load 26 is turned off, i.e., at the moment when the power source 21 is turned off, the power supply to the load 26 is turned off at once too.

When the electronic device enters a sleep mode, the second voltage control signal C2 output from the leading edge delay circuit 25 to the slow turn-on circuit 24 becomes transient, for example, from high level to low level. At the same time, the switch voltage signal S1 output from the slow turn-on circuit 24 to the electronic switch 22 becomes transient, for example, from a stable voltage Vd to the power source voltage V1. After the switch voltage signal S1 has become the power source voltage V1, the electronic switch 22 is turned off at once. In this way, in a sleep mode, although the power source continuously outputs the power source voltage V1, the power supply to the load 26 is turned off. As a result, the power consumption of the electronic device is decreased.

Figure 3:
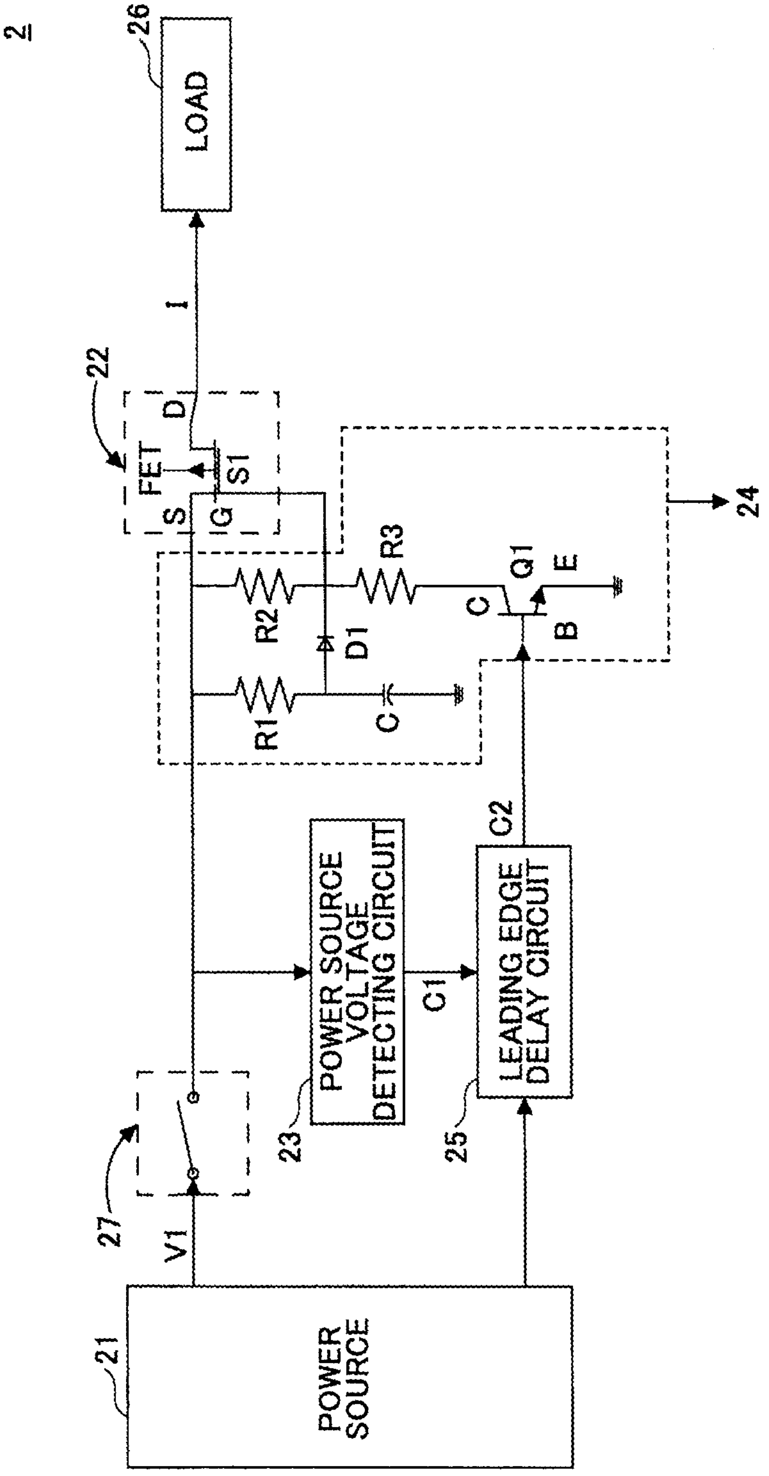
FIG. 3 illustrates an example of a circuit of a main part of a power supply circuit according to an embodiment of the present invention.

FIG. 3 illustrates an example of a circuit of a main part of a power supply circuit according to an embodiment of the present invention.

As a variant example of the above described power supply circuit 2, a mechanical switch 27 is further connected in series between the power source 21 and the electronic switch 22 as shown in FIG. 3. The mechanical switch 27 is configured to control the turn-on and the turn-off of the power source 21. The power source voltage detecting circuit 23 is configured to detect the power source voltage V1 downstream of the mechanical switch 27.

Moreover, as a variant example of the above respective examples of the power source circuit 2, the slow turn-on circuit 24 comprises a first resistor R1, a capacitor C, a second resistor R2, a third resistor R3, a transistor Q1, and a diode D1.

The first resistor R1 is configured such that its first end is connected to a first end S of the electronic switch 22. The capacitor C is configured to be connected between a second end of the first resistor R1 and ground GND. The second resistor R2 is configured such that its first end is connected to the first end S of the electronic switch 22. The third resistor R3 is configured such that its first end is connected to a second end of the second resistor R2 and a control end G of the electronic switch 22. The transistor Q1 is configured such that its base B receives the second voltage control signal C2, its collector C is connected to a second end of the third resistor R3, and its emitter E is connected to ground GND. The diode D1 is configured to be connected between the second end of the first resistor R1 and the second end of the second resistor R2. When the transistor Q1 is turned on, the first capacitor C may discharge via the diode D1, and then the first capacitor C may be charged within the predetermined time period T for delay.

Moreover, as a variant example of the above respective examples of the power source circuit 2, the electronic switch 22 is, for example, a field effect transistor FET whose source S serves as the first end S of the electronic switch 22, whose gate G serves as the control end G of the electronic switch 22, and whose drain D serves as the second end of the electronic switch 22.

Here it should be noted that the electronic switch 22 may be any electronic switch aside from the FET.

In what follows, a process, carried out by the power source circuit 2, of suppressing the inrush current generated at the moment when the power source 21 is turned on and decreasing the power consumed when the electric device is in a sleep mode is further described by referring to FIGS. 3 and 4.

For example, the electronic device 26 is a printer. If a malfunction such as a paper jam occurs in the printer, then it is necessary to open the door of the printer to carry out maintenance. However, when the printer works normally, its door is in a closed state. The door of the printer and the mechanical switch 27 are set as a mechanical linkage. That is to say, if the door of the printer is opened, then the mechanical switch 27 is turned off; if the door of the printer is closed, then the mechanical switch 27 is turned on.

In a state where the door of the printer is closed, the mechanical switch 27 is turned on, and the power source voltage detecting circuit 23 detects the power source voltage V1 downstream of the mechanical switch 27. At this time, the power source detecting circuit 23 generates the first voltage control signal C1, and outputs it to the leading edge delay circuit 25; for example, the first voltage control signal C1 is high level. After the leading edge delay circuit 25 has received the first voltage control signal C1, it outputs the second voltage control signal C2 to the base B of the transistor Q1. The second voltage control signal C2 is delayed by a predetermined time period T; for example, the second voltage control signal C2 is high level. During the predetermined time period T from the time point when the first voltage control signal C1 is generated to the time point when the second voltage control signal C2 is generated, the power source 21 carries out charging with respect to the capacitor C1 via the resistor R1, and the capacitor C becomes charged within this time period T. As a result, this predetermined time period T is longer than the charge time of the capacitor C, for example, a time 3RC. At this time, the voltages of the source and the gate of the FET are both the power source voltage V1, $V_{GS}$ of the FET is zero (0), and the current control component FET is in a closed state. In the above process, the diode D1 is in a reverse blocking state. Then the transistor Q1 is turned on under the control of second voltage control signal C2. At this time, a circuit, i.e., "power source 21-mechanical switch 27-resistor R2-resistor R3-transistor Q1-GND" is generated where the resistors R2 and R3 serve as voltage dividers, and the diode D1 is turned on. After the transistor Q1 is turned on, a discharge circuit, i.e., "capacitor C-diode D1-resistor R3-transistor Q1-GND" is generated. With the discharge of the capacitor C, the voltage of the gate of the FET decreases, the voltage of the source of the FET is the power source voltage V1, $V_{GS}$ of the FET increases, the current flowing through the FET increases slowly, and the FET is turned on slowly. When the capacitor C discharges until its voltage reaches a stable voltage $V_s$, the FET is normally turned on. Here, Vs=V1*R3/(R3+R), R=R2*R1/(R2+R1), and the waveform of $V_{GS}$ is as shown in (e) of FIG. 4. As a result, when the power source 21 is turned on, the current I flowing through the electronic switch 22 to the load 26 does not increase quickly, but increases slowly. In this way, the inrush current generated at the moment when the power source 21 is turned on may be suppressed.

When the door of the printer is opened, the mechanical switch 27 is turned off. The power source voltage detecting circuit 23 cannot detect the power source voltage V1 downstream of the mechanical switch 27. At this time, the first voltage control signal C1 output from the power source voltage detecting circuit 23 to the leading edge delay circuit 25 becomes transient, for example, from high level to low level. At the same time, the second voltage control signal C2 output from the leading edge delay circuit 25 to the transistor Q1 becomes transient, for example, from high level to low level. After the gate of the transistor Q1 has received the low level, it is turned off at once. After the transistor Q1 is turned off, the voltages of the source and the gate of the FET are both the power source voltage V1, $V_{GS}$ of the FET is zero (0), and the FET is turned off at once. In this way, when the door of the printer is opened, the FET is turned off at once, and the power supply to the load 26 is turned off at once too.

When the electronic device needs to enter a sleep mode, the second voltage control signal C2 output from the leading edge delay circuit 25 to the slow turn-on circuit 24 becomes transient, for example, from high level to low level. At the same time, the second voltage control signal C2 output from the leading edge delay circuit 25 to the transistor Q1 becomes transient, for example, from high level to low level. After the gate of the transistor Q1 has received the low level, it is turned off immediately. After the transistor Q1 is turned off, the voltages of the source and the gate of the FET are both the power source voltage V1, $V_{GS}$ of the FET is zero (0), and the FET is turned off immediately. In this way, in a sleep mode, although the power source 21 continuously outputs the power source voltage V1, the power supply to the load 26 is turned off. As a result, the power consumption of the electronic device is decreased.

Moreover, as a variant example of the above respective examples of the power source circuit 2, the leading edge delay circuit 25 is, for example, a MCU. In this MCU, a delay program is stored in advance so that the leading edge of the second voltage control signal C2 may be delayed by the predetermined time period T relative to the first voltage control signal C1.

Moreover, as a variant example of the above respective examples of the power source circuit 2, the leading edge delay circuit 25 is, for example, a combination of plural independent electronic components. For example, the leading edge delay circuit 25 includes a triangle waveform generator circuit. The threshold value points obtained based on the intersection between the triangle waveform and the second voltage control signal C2 corresponds to the delay time period T.

Figure 5:
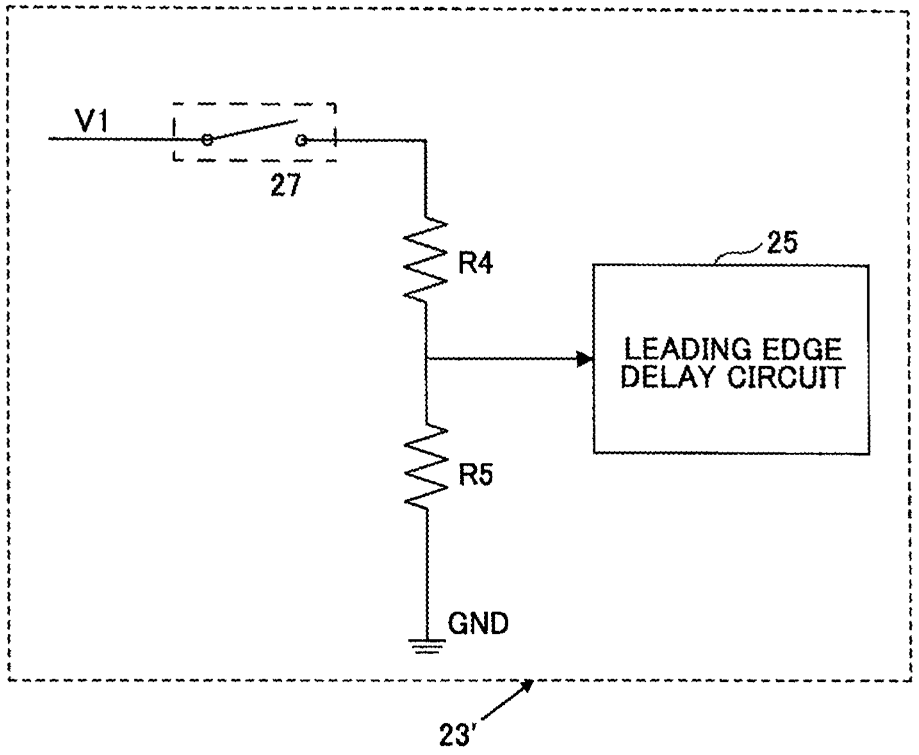
FIG. 5 illustrates an example of a power source voltage detecting circuit in a power supply circuit according to an embodiment of the present invention.

FIG. 5 illustrates an example of a power source voltage detecting circuit in a power supply circuit according to an embodiment of the present invention.

As a variant example of the above respective examples of the power source circuit 2, a power source voltage detecting circuit 23' has a resistor R4 and a resistor R5 as shown in FIG. 5. A first end of the resistor R4 is connected to a first end of the mechanical switch 27, and a second end of the resistor R4 is connected to a first end of the resistor R5. A second end of the resistor R5 is connected to ground. The connecting point of the resistor R4 and the resistor R5 is connected to the leading edge delay circuit 25.

Figure 6:
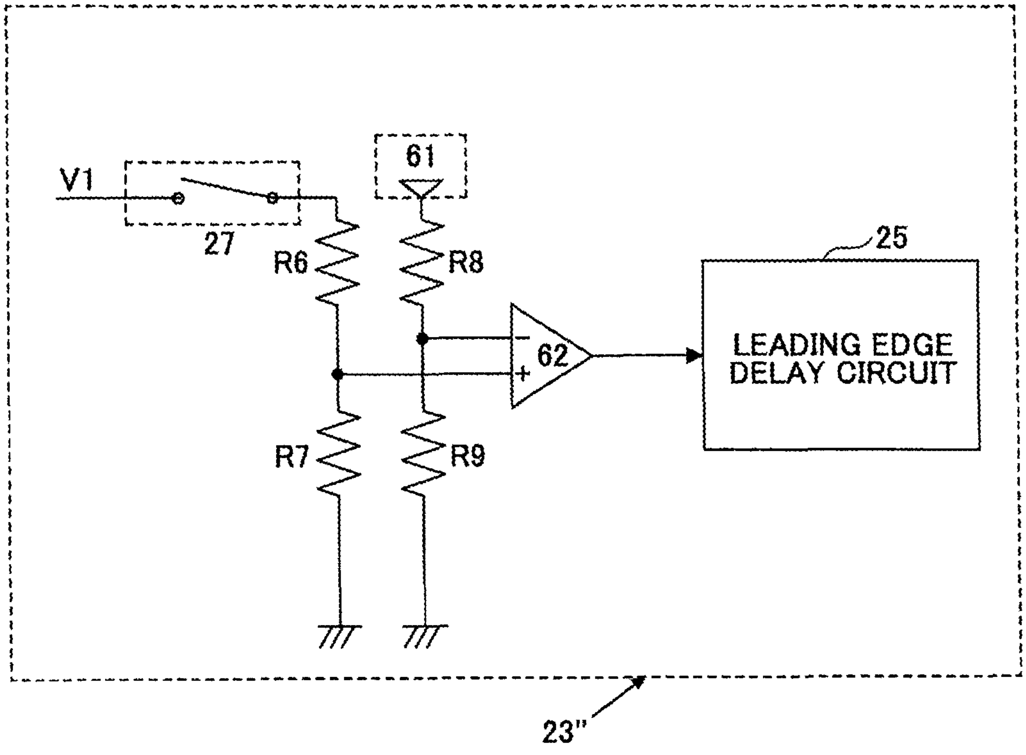
FIG. 6 illustrates another example of a power source voltage detecting circuit in a power supply circuit according to an embodiment of the present invention.

FIG. 6 illustrates another example of a power source voltage detecting circuit in a power supply circuit according to an embodiment of the present invention.

As a variant example of the above respective examples of the power source circuit 2, a power source voltage detecting circuit 23" has a resistor R6, a resistor R7, a resistor R8, a resistor R9, a comparator 62, and a reference power source 61. A first end of the resistor R6 is connected to a first end of the mechanical switch 27, a second end of the resistor R6 is connected to a first end of the resistor R7, and a second end of the resistor R7 is connected to ground. A first input end (for example, a minus input end) of the comparator 62 is connected to the connecting point of the resistor R8 and the resistor R9, a second input end (for example, a plus input end) of the comparator 62 is connected to the connecting point of the resistor R6 and the resistor R7, and an output end of the comparator 62 is connected to the leading edge delay circuit 25.

While the present invention is described with reference to the specific embodiments chosen for purpose of illustration, it should be apparent that the present invention is not limited to these embodiments, but numerous modifications could be made thereto by those people skilled in the art without departing from the basic concept and technical scope of the present invention.

The present application is based on and claims the benefit of priority of Chinese Priority Patent Application No. 201210366318.2 filed on Sep. 27, 2012, the entire contents of which are hereby incorporated by reference.

What is claimed is:

1. A power supply circuit of an electric device, comprising:

a power source configured to output a power source voltage by which direct current is provided to a load;

a power source voltage detecting circuit configured to detect the power source voltage, and to output a first voltage control signal whose leading edge corresponds to turn-on of the power source and whose trailing edge corresponds to turn-off of the power source;

a leading edge delay circuit configured to receive the first voltage control signal, and to output a second voltage control signal whose leading edge is delayed by a predetermined time period relative to the leading edge of the first voltage control signal and whose trailing edge coincides with the trailing edge of the first voltage control signal;

an electronic switch connected in series between the power source and the load, configured to turn on or turn off power supply from the power source to the load; and a slow turn-on circuit configured to receive the second voltage control signal, wherein, the slow turn-on circuit outputs, to the electronic switch, a switch voltage signal whose leading edge is used to control turn-on of the electronic switch and whose trailing edge is used to control turn-off of the electronic switch;

a start time of the leading edge of the switch voltage signal coincides with a start time of the leading edge of the second voltage control signal, but a rate of change of the leading edge of the switch voltage signal is slower than a rate of change of the leading edge of the second voltage control signal, so that when the power source is turned on, a current flowing through the electronic switch is low enough to not be able to ruin a component through which the current flows; and the trailing edge of the switch voltage signal coincides with the trailing edge of the second voltage control signal.

2. The power supply circuit according to claim 1, wherein:

a mechanical switch is connected in series between the power source and the electronic switch, and is configured to control the turn-on or the turn-off of the power source; and the power source voltage detecting circuit is configured to detect a power source voltage downstream of the mechanical switch.

3. The power supply circuit according to claim 1, wherein, the slow turn-on circuit includes:

a first resistor whose first end is connected to a first end of the electronic switch;

a capacitor connected between a second end of the first resistor and ground;

a second resistor whose first end is connected to the first end of the electronic switch;

a third resistor whose first end is connected to a second end of the second resistor and a control end of the electronic switch;

a transistor whose base receives the second voltage control signal, whose collector is connected to the second end of the third resistor, and whose emitter is connected to the ground; and a diode connected between the second end of the first resistor and the second end of the second resistor, wherein, when the transistor is turned on, the capacitor discharges via the diode, and then the capacitor becomes charged within the predetermined time period.

4. The power supply circuit according to claim 1, wherein:

the electronic switch is a field effect transistor whose source serves as the first end of the electronic switch, whose gate serves as the control end of the electronic switch, and whose drain serves as a second end of the electronic switch.

* * * * *